(12) United States Patent
Mo et al.

(10) Patent No.: US 9,140,933 B2
(45) Date of Patent: Sep. 22, 2015

(54) CONNECTION PAD GROUP FOR PHOTO-ALIGNMENT PROCESS OF LIQUID CRYSTAL PANEL

(71) Applicants: Shengpeng Mo, Guangdong (CN); Wenpin Chiang, Guangdong (CN)

(72) Inventors: Shengpeng Mo, Guangdong (CN); Wenpin Chiang, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 449 days.

(21) Appl. No.: 13/704,186

(22) PCT Filed: Oct. 24, 2012

(86) PCT No.: PCT/CN2012/083438
§ 371 (c)(1),
(2) Date: Dec. 13, 2012

(87) PCT Pub. No.: WO2014/040335
PCT Pub. Date: Mar. 20, 2014

(65) Prior Publication Data
US 2015/0192829 A1 Jul. 9, 2015

(30) Foreign Application Priority Data
Sep. 17, 2012 (CN) .......................... 2012 1 0344289

(51) Int. Cl.
*G02F 1/1337* (2006.01)
*H01L 27/12* (2006.01)
(52) U.S. Cl.
CPC ........ *G02F 1/133788* (2013.01); *H01L 27/124* (2013.01)

(58) Field of Classification Search
CPC .................. G02F 1/1345; G02F 2001/13775; G02F 1/133788; H01L 27/124
See application file for complete search history.

(56) References Cited

U.S. PATENT DOCUMENTS

| 7,320,900 | B2 | 1/2008 | Tanaka et al. |
| 8,345,195 | B2 * | 1/2013 | Han et al. ...................... 349/124 |
| 2007/0046320 | A1 | 3/2007 | Kang et al. |
| 2008/0002130 | A1 | 1/2008 | Kil |
| 2008/0036956 | A1 | 2/2008 | Tung et al. |
| 2013/0000118 | A1 * | 1/2013 | Xu ................................. 29/874 |

(Continued)

FOREIGN PATENT DOCUMENTS

| CN | 1439921 | 9/2003 |
| CN | 1916709 | 2/2007 |

(Continued)

*Primary Examiner* — Jaehwan Oh
(74) *Attorney, Agent, or Firm* — Kirton McConkie; Evan R. Witt

(57) ABSTRACT

A connection pad group for photo-alignment process of liquid crystal panel is disclosed. The connection pad group has a plurality of subgroups. Each subgroup includes at least one common-line connection pad, gate-line connection pad, data-line connection pad and common-electrode connection pad. The common-line connection pads are connected to a first extension connection pad together; the gate-line connection pads are connected to a second extension connection pad together; the data-line connection pads are connected to a third extension connection pad together; the common-electrode connection pads are connected to a fourth extension connection pad together. The present invention prevents poor electrical contact from occurring between pads and a voltage-applying device since the pads are small in size and excessive in number.

14 Claims, 5 Drawing Sheets

(56) References Cited

U.S. PATENT DOCUMENTS

2013/0293521 A1    11/2013  Xu
2014/0087620 A1*   3/2014   Wang et al. ................. 445/62

FOREIGN PATENT DOCUMENTS

| CN | 102402084 | 4/2012 |
|----|-----------|--------|
| CN | 102662264 | 9/2012 |

* cited by examiner

CONNECTION PAD GROUP FOR PHOTO-ALIGNMENT PROCESS OF LIQUID CRYSTAL PANEL

BACKGROUND OF THE INVENTION

1. Field of the Invention

The present invention relates to liquid crystal display manufacturing technology, especially to a connection pad group which is used for photo-alignment process of liquid crystal panel and is easy to apply voltage thereto.

2. Description of the Related Art

In the manufacturing process of liquid crystal display device, in order to stably control the pre-tilt angle of liquid crystal molecules, manufacturers have developed a photo-alignment technology.

With reference to FIG. 1, a conventional thin-film transistor liquid crystal panel includes a color filter substrate 90, a thin-film transistor array substrate 91 opposite to the color filter substrate 90, alignment films 92 disposed on the inner surfaces of the color filter substrate 90 and the thin-film transistor array substrate 91, and a liquid crystal layer 93 disposed between the color filter substrate 90 and the thin-film transistor array substrate 91. The liquid crystal layer 93 has liquid crystal molecules 930 and further has monomers 931 which are used for photo-alignment.

When performing the photo-alignment process, a voltage-applying device is electrically connected to the electrodes of the color filter substrate 90 and the thin-film transistor array substrate 91 so as to provide an electric potential difference therebetween to make the liquid crystal molecules 930 to tilt under an electric field; meanwhile, a light source device emits ultra-violet lights 800 into the liquid crystal layer 93 so as to make the monomers 931 to form a polymer layer 9310. The polymer layer 9310 can accurately keep the liquid crystal molecules 930 to have the same pre-tilt angle.

In general, with reference to FIG. 2, when manufacturing foregoing liquid crystal panel, the manufacturer first disposes a plurality of thin-film transistor array blocks 910 on a large-sized glass substrate 9, then correspondingly disposes a liquid crystal layer and a color-filter substrate 90 on each of the thin-film transistor array blocks 910 to form a plurality of panel units, and then the glass substrate is cut into a plurality of individual liquid crystal panels.

The aforementioned photo-alignment process is performed before the cutting process. During applying voltages, a connection pad row 7 is mounted at one side of the glass substrate 9, wherein according to the number of the panel units on the glass substrate 9, the connection pad row 7 has a plurality of connection pads arranged side by side for electrical connection of the voltage-applying device.

In the voltage-applying step of the traditional photo-alignment process, each panel unit requires at least six connection pads for the voltage-applying device to perform electrical connection and apply voltages for performing the photo-alignment process. For example, when the glass substrate 9 includes three panel units, with further reference to FIG. 3, the connection pad row 7 has nineteen connection pads, respectively labeled 1-19, wherein, connection pads 1-6 are in a first connection pad group 70a, connection pads 7-12 are in a second connection pad group 70b, connection pads 13-18 are in a third connection pad group 70c. The connection pads in each of the connection pad group are respectively connected to the related conductive lines of the corresponding panel unit. The conductive lines are arranged in a pixel array and include common lines, gate lines activating odd-numbered pixel rows, gate lines activating even-numbered pixel rows, data lines transferring data of red-pixels, data lines transferring data of green pixels and data line transferring data of blue-pixels. And the nineteenth connection pad is correspondingly connected to the common electrodes on the color filter substrates of the three panel units.

However, because of those excessive connection pads, the voltage-applying device has to use a lot of probes for electric connection; meanwhile, since the size of each connection pad is only 3 mm×5 mm and may affect the contact accuracy of the probes of the voltage-applying device, if there is a positional deviation in the arrangement of the probes or the positions of the connection pads, or the probes have been worn down, poor electrical contact between the voltage-applying device and the connection pad row 7 may occur and cause the photo-alignment process to fail.

Therefore, it is necessary to provide a connection pad group for photo-alignment process of liquid crystal panel to overcome the problems existing in the conventional technology.

SUMMARY OF THE INVENTION

In view of the shortcomings of the conventional technology, the main objective of the invention is to provide a connection pad group for photo-alignment process of liquid crystal panel so as to prevent poor electrical contact from occurring between pads and a voltage-applying device since the pads are small in size and excessive in number.

In order to achieve the foregoing object of the present invention, the present invention provides a connection pad group for photo-alignment process of liquid crystal panel which comprises:

a connection pad row having a plurality of subgroups, and each of the subgroups includes a common-line connection pad, two gate-line connection pads and three data-line connection pads; the subgroups share a common-electrode connection pad; the number of the subgroups corresponds to the number of panel units on a glass substrate; and an extension connection pad row having a first extension connection pad, a second extension connection pad, a third extension connection pad and a fourth extension connection pad, wherein the common-line connection pad of each of the subgroups is connected the first extension connection pad; the gate-line connection pads of each of the subgroups are connected the second extension connection pad; the data-line connection pads of each of the subgroups are connected the third extension connection pad; the common-electrode connection pad of the subgroups is connected the fourth extension connection pad; and an arrangement direction in which the extension connection pads of the extension connection pad row are arranged is perpendicular to an arrangement direction in which the subgroups of the connection pad row are arranged.

In one embodiment of the present invention, teach of the panel units on the glass substrate has common lines, gate lines, data lines and a common electrode; the common-line connection pad of each of the subgroups of the connection pad row is used to be connected to the common lines of a corresponding panel unit; the gate-line connection pads of each of the subgroups of the connection pad row are used to be connected to the gate lines of the corresponding panel unit; the data-line connection pads of each of the subgroups of the connection pad row are used to be connected to the data lines of the corresponding panel unit; and the common-electrode connection pad shared by the subgroups of the connection pad row is used to be connected to the common electrode of the corresponding panel unit.

The present invention further provides a connection pad group for photo-alignment process of liquid crystal panel which comprises:

a connection pad row having a plurality of subgroups, and each of the subgroups includes at least one common-line connection pad, at least one gate-line connection pad, at least one data-line connection pad and at least one common-electrode connection pad; and an extension connection pad row having a first extension connection pad, a second extension connection pad, a third extension connection pad and a fourth extension connection pad, wherein the at least one common-line connection pad of each of the subgroups is connected the first extension connection pad, the at least one gate-line connection pad of each of the subgroups is connected the second extension connection pad, the at least one data-line connection pad of each of the subgroups is connected the third extension connection pad, the at least one common-electrode connection pad of each of the subgroups is connected the fourth extension connection pad.

In one embodiment of the present invention, the at least one common-line connection pad is used to be connected to common lines of a panel unit; the at least one gate-line connection pad is used to be connected to gate lines of the panel unit; the at least one data-line connection pad is used to be connected to the data lines of the panel unit; and the at least one common-electrode connection pad is used to be connected to a common electrode of the panel unit.

In one embodiment of the present invention, each of the subgroups includes a common-line connection pad, two gate-line connection pads, three data-line connection pads and a common-electrode connection pad.

In one embodiment of the present invention, the subgroups share one common-electrode connection pad.

In one embodiment of the present invention, the number of the subgroups corresponds to the number of a plurality of panel units mounted on a glass substrate.

In one embodiment of the present invention, the connection pad row has three subgroups which respectively correspond to three panel units.

In one embodiment of the present invention, the three subgroups share one common-electrode connection pad, and each subgroup includes a common-line connection pad, two gate-line connection pads and three data-line connection pads.

In one embodiment of the present invention, the common-line connection pad is correspondingly connected to the common lines of one panel unit; one of the gate-line connection pads is correspondingly connected to odd-numbered gate lines of the panel unit and the other one of the gate-line connection pads is correspondingly connected to even-numbered gate lines of the panel unit; one of the three data-line connection pads is connected to red-pixel data lines of the panel unit, another one of the three data-line connection pads is connected to green-pixel data lines of the panel unit, and the other one of the three data-line connection pads is connected to blue-pixel data lines of the panel unit; and the common-electrode connection pad is correspondingly connected to a common electrode of the panel unit.

In one embodiment of the present invention, the connection pad row is mounted at one side of the panel units.

In one embodiment of the present invention, an arrangement direction in which the extension connection pads of the extension connection pad row are arranged is perpendicular to an arrangement direction in which the subgroups of the connection pad row are arranged.

The present invention is to make connection pads which are to be applied with the same voltage (for example, the pads that are connected to common lines of a panel unit) to connect to an extension connection pad. Once the extension connection pad is applied with voltage, it can provide voltages to those connection pads at the same time to perform photo-alignment process. Hence, the usage of probes can be reduced by arranging the extension connection pads and prevent poor electrical contact from occurring between pads and the voltage-applying device since the pads are small in size and excessive in number.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
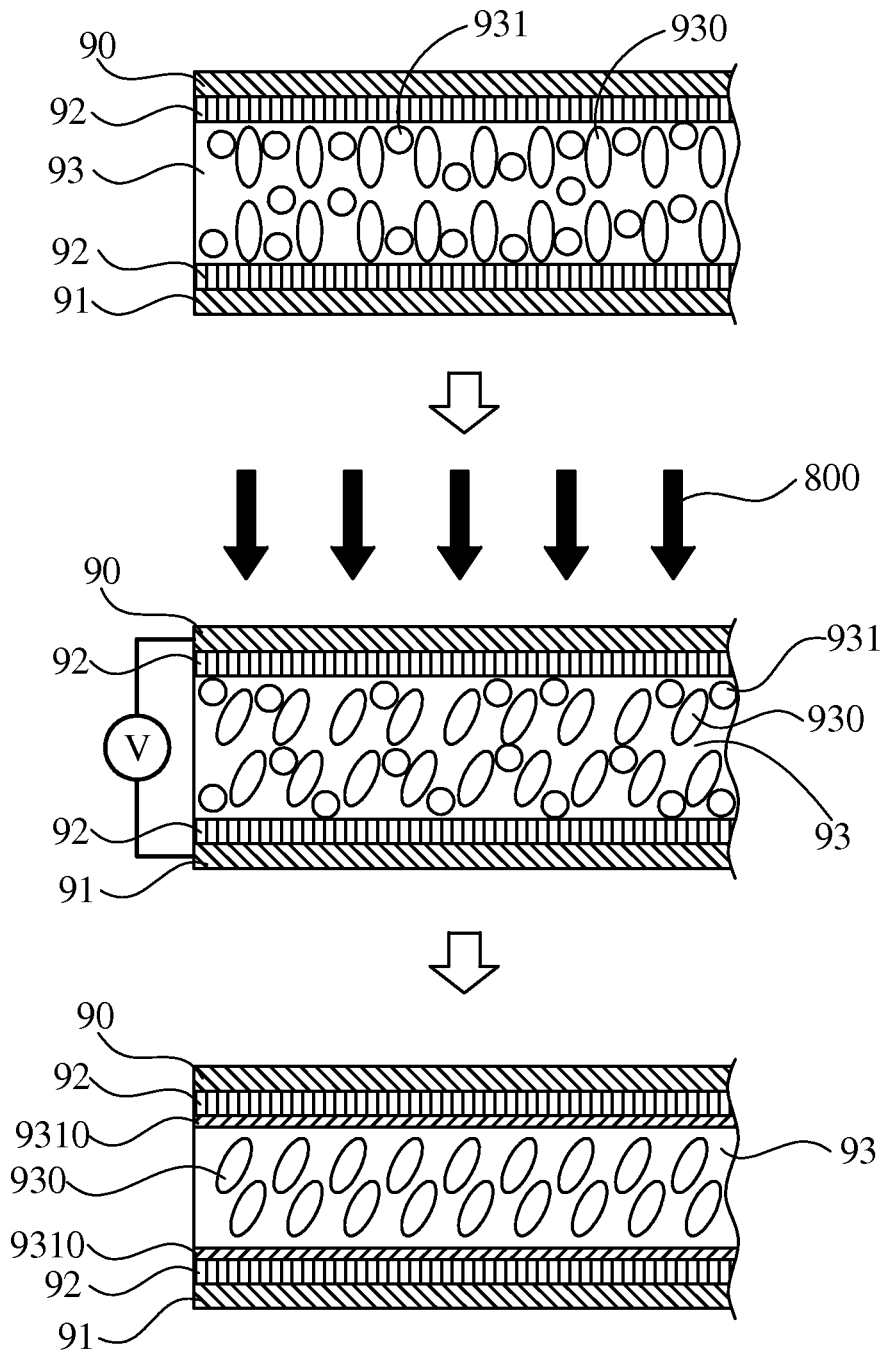
FIG. 1 is a schematic diagram of a conventional photo-alignment process of thin-film transistor liquid crystal panel.
Figure 2:
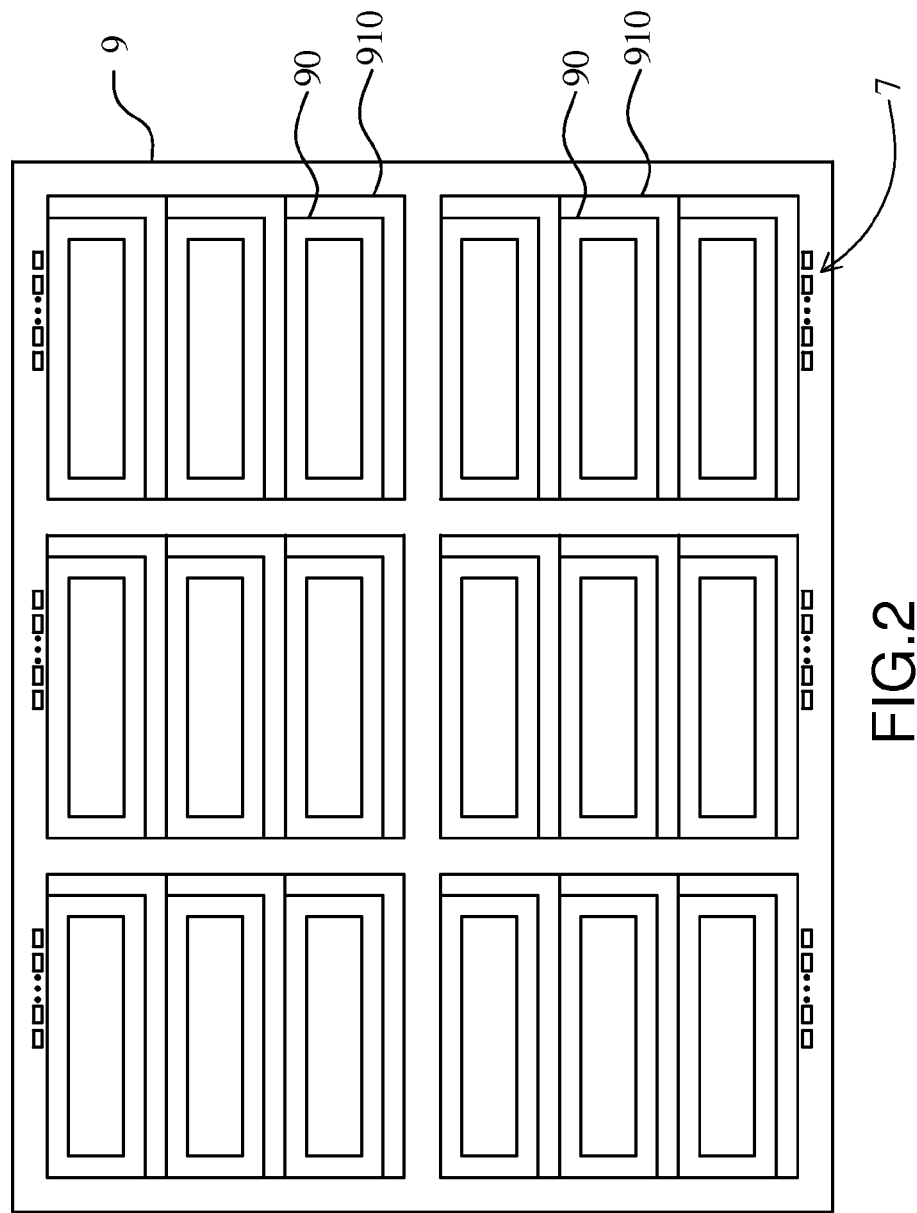
FIG. 2 is a schematic top view of a glass substrate where a plurality of panel units are mounted according to the prior art.
Figure 3:
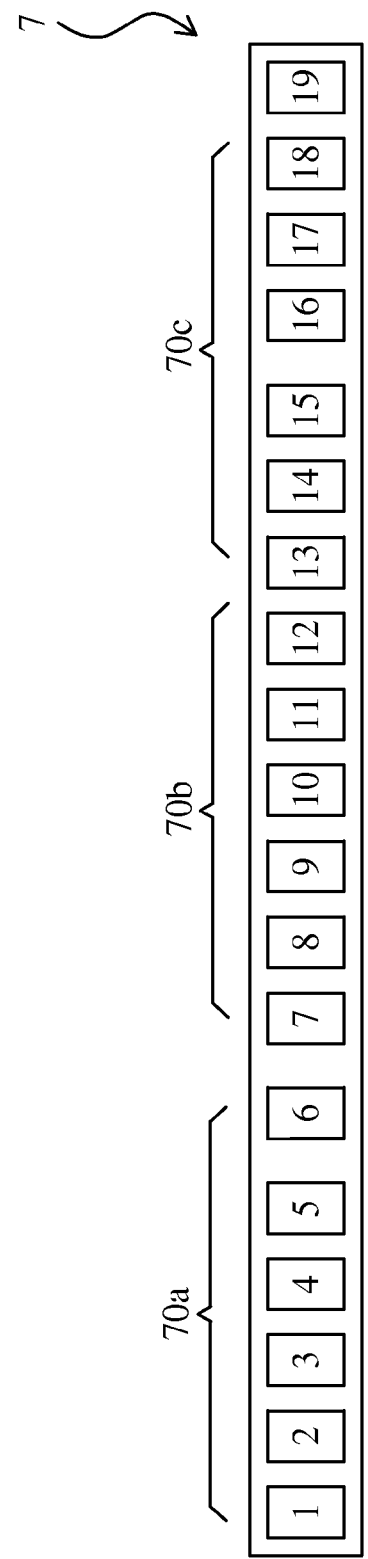
FIG. 3 is a schematic view of a conventional connection pad group for photo-alignment process of liquid crystal panel.
Figure 4:
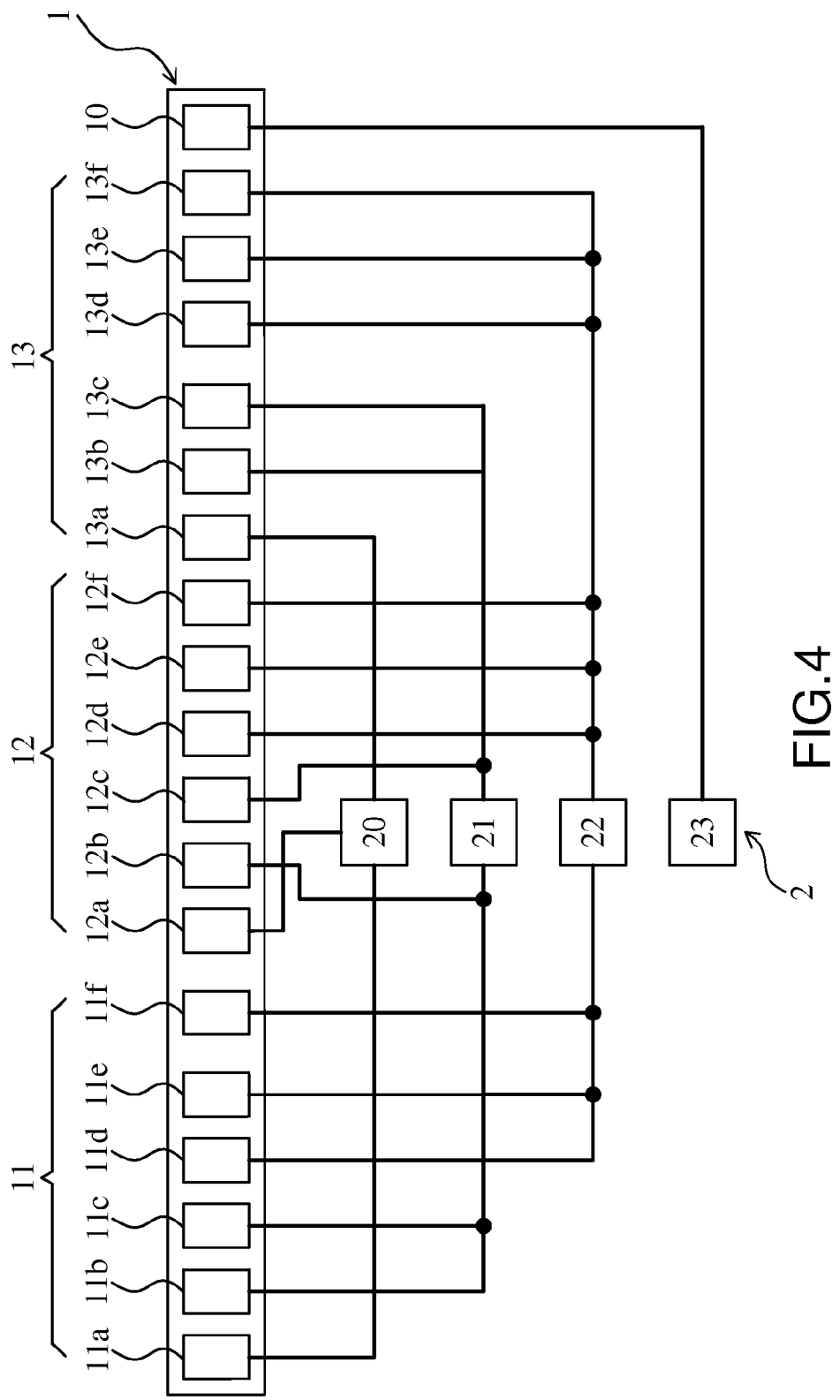
FIG. 4 is a schematic view of a connection pad group for photo-alignment process of liquid crystal panel according to a preferred embodiment of the present invention.

With reference to FIG. 4, FIG. 4 is a schematic view of the arrangement of a connection pad group for photo-alignment process of liquid crystal panel according to a preferred embodiment of the present invention. The connection pad group comprises a connection pad row 1 and an extension connection pad row 2.

The connection pad row 1 has a plurality of subgroups which is arranged in a line, wherein each of the subgroups includes at least one common-line connection pad, at least one gate-line connection pad, at least one data-line connection pad and at least one common-electrode connection pad. The at least one common-line connection pad is used to be connected to common lines of a panel unit; the at least one gate-line connection pad is used to be connected to gate lines of the panel unit; the at least one data-line connection pad is used to be connected to data lines of the panel unit; and the at least one common-electrode connection pad is used to be connected to a common electrode of the panel unit.

Figure 5:
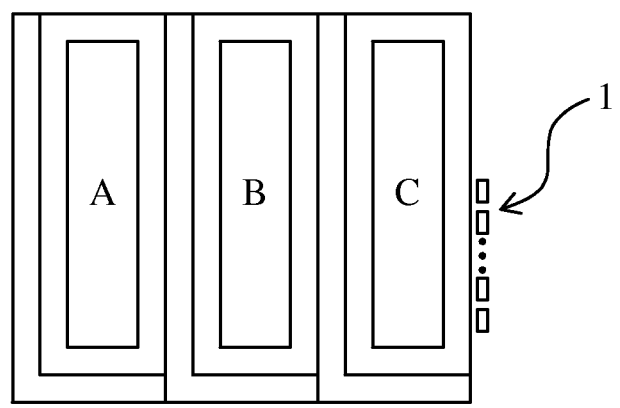
FIG. 5 is a schematic view of the connection pad group arranged at one side of the panel units according to a preferred embodiment of the present invention.

It is worth noting that, the number of the subgroups 11, 12, 13 corresponds to the number of a plurality of panel units mounted on a glass substrate. As shown in FIG. 5, in a preferred embodiment, the connection pad row 1 is mounted at one side of three panel units, and the three panel units are first panel unit A, second panel unit B and third panel unit C. Thus, the connection pad row 1 in FIG. 4 has three subgroups 11, 12, 13, respectively correspond to the three panel units A, B, C.

Each of the panel units A, B, C has common lines, gate lines, data lines and a common electrode, wherein the gate lines may be further divided into odd-numbered gate lines and even-numbered gate lines; the data lines may be further divided into red-pixel data lines, green-pixel data lines and blue-pixel data lines. Correspondingly, each of the subgroups preferably includes a common-line connection pad, two gate-line connection pads, three data-line connection pads and a common-electrode pad, wherein the common-line connection pad is correspondingly connected to the common lines of one panel unit; one of the gate-line connection pads is correspondingly connected to the odd-numbered gate lines of the panel unit and the other one of the gate-line connection pads is correspondingly connected to the even-numbered gate lines of the panel unit; one of the three data-line connection pads is connected to the red-pixel data lines of the panel unit, another one of the three data-line connection pads is connected to the green-pixel data lines of the panel unit, and the other one of the three data-line connection pads is connected to the blue-pixel data lines of the panel unit; and the common-electrode connection pad is correspondingly connected to the common electrode of the panel unit.

In more detail, with reference to FIGS. 4 and 5, corresponding to the three panel units A, B, C, the subgroups of the connection pad row 1 respectively are: first subgroup 11, second subgroup 12 and third subgroup 13, wherein the first subgroup 11 includes a common-line connection pad 11a, two gate-line connection pads 11b, 11c, three data-line connection pads 11d, 11e, 11f and a common-electrode connection pad 10; the second subgroup 12 includes a common-line connection pad 12a, two gate-line connection pads 12b, 12c, three data-line connection pads 12d, 12e, 12f and a common-electrode connection pad 10; the third subgroup 13 includes a common-line connection pad 13a, two gate-line connection pads 13b, 13c, three data-line connection pads 13d, 13e, 13f and a common-electrode connection pad 10. It is worth noting that, in this embodiment, the subgroups share one common-electrode connection pad 10.

With reference to FIG. 4, the extension connection pad row 2 has a first extension connection pad 20, a second extension connection pad 21, a third extension connection pad 22 and a fourth extension connection pad 23, wherein the common-line connection pad of each of the subgroups is connected the first extension connection pad 20; the gate-line connection pads of each of the subgroups are connected the second extension connection pad 21; the data-line connection pads of each of the subgroups are connected the third extension connection pad 22; the common-electrode connection pad of the subgroups is connected the fourth extension connection pad 23. In more detail, the common-line connection pad 11a of the first subgroup 11, the common-line connection pad 12a of the second subgroup 12 and the common-line connection pad 13a of the third subgroup 13 are connected to the first extension connection pad 20 together; both of the gate-line connection pads 11b, 11c of the first subgroup 11, both of the gate-line connection pads 12b, 12c of the second subgroup 12 and both of the gate-line connection pads 13b, 13c of the third subgroup 13 are connected to the second extension connection pad 21 together; the three data-line connection pads 11d,11e,11f of the first subgroup 11, the three data-line connection pads 12d,12e,12f of the second subgroup 12 and the data-line connection pads 13d,13e,13f of the third subgroup 13 are connected to the third extension connection pad 22 together; and the common-electrode connection pad 10 is connected to the fourth extension connection pad 23. In this embodiment, an arrangement direction in which the extension connection pads of the extension connection pad row 2 are arranged is perpendicular to an arrangement direction in which the subgroups of the connection pad row 1 are arranged.

By the above description, since each of the panel units has the same common lines, gate lines, data lines and common electrode, thus, when making the connection pads of the subgroups which are connected to the same kind of conductive lines of each panel unit to be further connected to the same extension connection pad, a voltage applying device can apply a voltage to the extension connection pad to achieve the object of applying voltage to the corresponding conductive lines of each panel unit for photo-alignment process.

Therefore, no matter how many the panel units are, the user can make the connection pads to be connected to the four extension connection pads separately based on the grouping on common lines, gate lines, data lines and common electrode. Take the embodiment in FIG. 4 as an example, the voltage applying device can perform voltage-applying to 19 connection pads through the four extension connection pads. Thus, the usage of probes can be enormously reduced; meanwhile, the distance between the extension connection pads can be appropriately increased so that the contact accuracy of the probes will not be affected by narrow distance, so that the yield rate of photo-alignment process can be increased.

In conclusion, the present invention is to make connection pads which are to be applied with the same voltage (for example, the pads that are connected to common lines of a panel unit) to connect to an extension connection pad. Once the extension connection pad is applied with voltage, it can provide voltages to those connection pads at the same time to perform photo-alignment process. Hence, the usage of probes can be reduced by arranging the extension connection pads and prevent poor electrical contact from occurring between pads and the voltage-applying device since the pads are small in size and excessive in number.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A connection pad group for photo-alignment process of liquid crystal panel comprising:
   a connection pad row having a plurality of subgroups, wherein each of the subgroups includes a common-line connection pad, two gate-line connection pads and three data-line connection pads; the subgroups share a common-electrode connection pad; the number of the subgroups corresponds to the number of a plurality of panel units mounted on a glass substrate; and
   an extension connection pad row having a first extension connection pad, a second extension connection pad, a third extension connection pad and a fourth extension connection pad, wherein the common-line connection pad of each of the subgroups is connected the first extension connection pad; the gate-line connection pads of each of the subgroups are connected the second extension connection pad; the data-line connection pads of each of the subgroups are connected the third extension connection pad; the common-electrode connection pad of the subgroups is connected the fourth extension connection pad; and an arrangement direction in which the extension connection pads of the extension connection pad row are arranged is perpendicular to an arrangement direction in which the subgroups of the connection pad row are arranged.

2. The connection pad group as claimed in claim 1, wherein each of the panel units on the glass substrate has common lines, gate lines, data lines and a common electrode; the common-line connection pad of each of the subgroups of the connection pad row is used to be connected to the common lines of a corresponding panel unit; the gate-line connection pads of each of the subgroups of the connection pad row are used to be connected to the gate lines of the corresponding panel unit; the data-line connection pads of each of the subgroups of the connection pad row are used to be connected to the data lines of the corresponding panel unit; and the common-electrode connection pad shared by the subgroups of the connection pad row is used to be connected to the common electrode of the corresponding panel unit.

3. The connection pad group as claimed in claim 2, wherein the connection pad row has three subgroups which respectively correspond to three panel units.

4. The connection pad group as claimed in claim 3, wherein the connection pad row is mounted at one side of the panel units.

5. A connection pad group for photo-alignment process of liquid crystal panel comprising:
a connection pad row having a plurality of subgroups, wherein each of the subgroups includes at least one common-line connection pad, at least one gate-line connection pad, at least one data-line connection pad and at least one common-electrode connection pad; and
an extension connection pad row having a first extension connection pad, a second extension connection pad, a third extension connection pad and a fourth extension connection pad, wherein the at least one common-line connection pad of each of the subgroups is connected the first extension connection pad, the at least one gate-line connection pad of each of the subgroups is connected the second extension connection pad, the at least one data-line connection pad of each of the subgroups is connected the third extension connection pad, the at least one common-electrode connection pad of each of the subgroups is connected the fourth extension connection pad.

6. The connection pad group as claimed in claim 5, wherein the at least one common-line connection pad is used to be connected to common lines of a panel unit; the at least one gate-line connection pad is used to be connected to gate lines of the panel unit; the at least one data-line connection pad is used to be connected to the data lines of the panel unit; and the at least one common-electrode connection pad is used to be connected to a common electrode of the panel unit.

7. The connection pad group as claimed in claim 5, wherein each of the subgroups includes a common-line connection pad, two gate-line connection pads, three data-line connection pads and a common-electrode connection pad.

8. The connection pad group as claimed in claim 5, wherein the subgroups share one common-electrode connection pad.

9. The connection pad group as claimed in claim 5, wherein the number of the subgroups corresponds to the number of a plurality of panel units mounted on a glass substrate.

10. The connection pad group as claimed in claim 9, wherein the connection pad row has three subgroups which respectively correspond to three panel units.

11. The connection pad group as claimed in claim 10, wherein the three subgroups share one common-electrode connection pad, and each subgroup includes a common-line connection pad, two gate-line connection pads and three data-line connection pads.

12. The connection pad group as claimed in claim 7, wherein the common-line connection pad is correspondingly connected to the common lines of one panel unit; one of the gate-line connection pads is correspondingly connected to odd-numbered gate lines of the panel unit and the other one of the gate-line connection pads is correspondingly connected to even-numbered gate lines of the panel unit; one of the three data-line connection pads is connected to red-pixel data lines of the panel unit, another one of the three data-line connection pads is connected to green-pixel data lines of the panel unit, and the other one of the three data-line connection pads is connected to blue-pixel data lines of the panel unit; and the common-electrode connection pad is correspondingly connected to a common electrode of the panel unit.

13. The connection pad group as claimed in claim 10, wherein the connection pad row is mounted at one side of the panel units.

14. The connection pad group as claimed in claim 5, wherein an arrangement direction in which the extension connection pads of the extension connection pad row are arranged is perpendicular to an arrangement direction in which the subgroups of the connection pad row are arranged.

* * * * *